US005705322A

United States Patent [19]

West et al.

[11] Patent Number: 5,705,322

[45] Date of Patent: Jan. 6, 1998

[54] METHOD OF PROVIDING AN IMAGE USING A NEGATIVE-WORKING INFRARED PHOTOSENSITIVE ELEMENT

[75] Inventors: Paul Richard West, Ft. Collins; Eugene Lynn Sheriff, Johnstown; Jeffery Allen Gurney, Greeley; Ralph Scott Schneebeli, Ft. Collins; Thomas Robert Jordan, Windsor; Gary Roger Miller, Ft. Collins, all of Colo.

[73] Assignee: Eastman Kodak Company, Rochester, N.Y.

[21] Appl. No.: 723,176

[22] Filed: Sep. 30, 1996

[51] Int. Cl.$^6$ .......... G03F 7/30

[52] U.S. Cl. .......... 430/325; 430/328; 430/944

[58] Field of Search .......... 430/190, 191, 430/192, 193, 325, 326, 328, 944

[56] References Cited

U.S. PATENT DOCUMENTS

| | | | |
|---|---|---|---|
| 3,046,120 | 7/1962 | Schmidt et al. . | |
| 3,837,860 | 9/1974 | Roos . | |
| 3,902,906 | 9/1975 | Iwama et al. . | |
| 4,306,010 | 12/1981 | Uehara et al. | 430/190 |
| 4,306,011 | 12/1981 | Uehara et al. | 430/190 |
| 4,308,368 | 12/1981 | Kubo et al. | 525/504 |
| 4,356,254 | 10/1982 | Takahashi et al. | 430/296 |
| 4,529,682 | 7/1985 | Toukhy | 430/190 |
| 4,544,627 | 10/1985 | Takahashi et al. | 430/325 |
| 4,576,901 | 3/1986 | Stahlhofen et al. | 430/325 |
| 4,609,615 | 9/1986 | Yamashita et al. | 430/325 |
| 4,927,741 | 5/1990 | Garth et al. | 430/309 |
| 5,145,763 | 9/1992 | Bassett et al. | 430/169 |
| 5,149,613 | 9/1992 | Stahlhofen et al. | 430/296 |
| 5,279,918 | 1/1994 | Nishi et al. | 430/190 |
| 5,340,699 | 8/1994 | Haley et al. | 430/302 |
| 5,368,977 | 11/1994 | Yoda et al. | 430/190 |
| 5,372,907 | 12/1994 | Haley et al. | 430/157 |
| 5,380,622 | 1/1995 | Roser | 430/325 |
| 5,437,952 | 8/1995 | Hirai et al. | 430/83 |
| 5,466,557 | 11/1995 | Haley et al. | 430/278 |
| 5,491,046 | 2/1996 | DeBoer et al. | 430/302 |

FOREIGN PATENT DOCUMENTS

| | | |
|---|---|---|
| 672954 | 9/1995 | European Pat. Off. . |
| 4426820 | 2/1995 | Germany . |
| 1546633 | 5/1979 | United Kingdom . |
| 2082339 | 3/1982 | United Kingdom . |
| 93/06528 | 4/1993 | WIPO . |
| 96/20429 | 7/1996 | WIPO . |

*Primary Examiner*—Christopher G. Young
*Attorney, Agent, or Firm*—J. Lanny Tucker

[57] ABSTRACT

An infrared imaging composition contains two essential components, namely an infrared radiation absorbing compound, and a phenolic resin that is either mixed or reacted with an o-diazonaphthoquinone derivative. These compositions are useful in photosensitive elements such as lithographic printing plates that can be used to provide images using laser imaging, followed by uniform exposure and development.

14 Claims, No Drawings

METHOD OF PROVIDING AN IMAGE USING A NEGATIVE-WORKING INFRARED PHOTOSENSITIVE ELEMENT

Related Application

Copending and commonly assigned U.S. Ser. No. 08/723,335, filed herewith this application on the same day, by West, Sheriff, Gurney, Schneebeli, Jordan and Miller and entitled "Infrared-Sensitive, Negative-Working Diazonaphthoquinone Imaging Composition and Element".

1. Field of the Invention

This invention relates to a method for providing an image using a photosensitive composition and negative-working element that are sensitive to infrared radiation. In particular, this invention relates to providing an image using negative-working lithographic printing plates.

2. Background of the Invention

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth and other materials. Commonly, the ink is transferred to an intermediate material called the blanket which in turn transfers the ink to the surface of the material upon which the image is to be reproduced.

A widely used type of lithographic printing plate has a light-sensitive coating applied to an aluminum base support. The coating may respond to light by having the portion that is exposed become soluble so that it is removed in the developing process. Such a plate is referred to in the art as a positive-working printing plate. Conversely, when that portion of the coating that is exposed becomes hardened, the plate is referred to as a negative-working plate. In both instances, the image areas remaining are ink-receptive or oleophilic and the non-image areas or background are water-receptive or hydrophilic. The differentiation between image and non-image areas is made in the exposure process where a film is applied to the plate with a vacuum to insure good contact. The plate is then exposed to a light source, a portion of which is composed of UV radiation. In the instance of negative-working plates, the areas on the film corresponding to the image areas are clear, allowing light to harden the image area coating, while the areas on the film corresponding to non-image areas are black preventing the light hardening process, so the areas not struck by light can be removed during development. The light-hardened surfaces of a negative-working plate are therefore oleophilic and will accept ink while the non-image areas that have had the coating removed through the action of a developer are desensitized and are therefore hydrophilic.

Various useful printing plates that can be either negative-working or positive-working are described, for example, in GB 2,082,339 (Horsell Graphic Industries), and U.S. Pat. No. 4,927,741 (Garth et al), both of which describe imaging layers containing an o-diazonaphthoquinone and a resole resin, and optionally a novolac resin. Another plate that can be similarly used is described in U.S. Pat. No. 4,708,925 (Newman) wherein the imaging layer comprises a phenolic resin and a radiation-sensitive onium salt. This imaging composition can also be used for the preparation of a direct laser addressable printing plate, that is imaging without the use of a photographic transparency.

Direct digital imaging of offset printing plates is a technology that has assumed importance to the printing industry. The first commercially successful workings of such technology made use of visible light-emitting lasers, specifically argon-ion and frequency doubled Nd:YAG lasers. Printing plates with high photosensitivities are required to achieve acceptable through-put levels using plate-setters equipped with practical visible-light laser sources. Inferior shelf-life, loss in resolution and the inconvenience of handling materials under dim lighting are trade-offs that generally accompany imaging systems exhibiting sufficiently high photosensitivities.

Advances in solid-state laser technology have made high-powered diode lasers attractive light sources for plate-setters. Currently, at least two printing plate technologies have been introduced that can be imaged with laser diodes emitting in the infrared regions, specifically at about 830 nm. One of these is described in EP 573,091 (Agfa) and in several patents and published applications assigned to Presstek, Inc [for example, U.S. Pat. No. 5,353,705 (Lewis et al), U.S. Pat. No. 5,351,617 (Williams et al), U.S. Pat. No. 5,379,698 (Nowak et al), U.S. Pat. No. 5,385,092 (Lewis et al) and U.S. Pat. No. 5,339,737 (Lewis et al)]. This technology relies upon ablation to physically remove the imaging layer from the printing plate. Ablation requires high laser fluences, resulting in lower through-puts and problems with debris after imaging.

A higher speed and cleaner technology is described, for example, in U.S. Pat. No. 5,340,699 (Haley et al), U.S. Pat. No. 5,372,907 (Haley et al), U.S. Pat. No. 5,466,557 (Haley et al) and EP-A-0 672 954 (Eastman Kodak) which uses near-infrared energy to produce acids in an imagewise fashion. These acids catalyze crosslinking of the coating in a post-exposure heating step. Precise temperature control is required in the heating step. The imaging layers in the plates of U.S. Pat. No. 5,372,907 (noted above) comprise a resole resin, a novolac resin, a latent Bronsted acid and an infrared absorbing compound. Other additives, such as various photosensitizers, may also be included.

DE-4,426,820 (Fuji) describes a printing plate that can be imaged in the near infrared at moderate power levels with relatively simple processing requirements. This printing plate has at least two layers: an imaging layer containing an o-diazonaphthoquinone compound and an infrared absorbing compound, and a protective overcoat containing a water-soluble polymer or silicone polymer. This plate is floodwise exposed with ultraviolet light to convert the o-diazonaphthoquinone to an indenecarboxylic acid, which is then imagewise decarboxylated by means of heat transferred from the infrared absorbing material. Development with an alkaline solution results in removal of areas not subjected to thermal decarboxylation. The pre-imaging floodwise exposure step, however, is awkward in that it precludes the direct loading of the printing plates into plate-setters.

Thus, there is a need for an imaging method that can be easily carried out in the near infrared at moderate power levels, and that requires relatively simple processing requirements.

SUMMARY OF THE INVENTION

The problems noted above with known methods are overcome with a negative-working photosensitive composition consisting essentially of:

a)
(i) a mixture of a phenolic resin and an o-diazonaphthoquinone derivative,
(ii) a reaction product of a resin and an o-diazonaphthoquinone reactive derivative, or
(iii) a mixture of (i) and (ii) and b) a compound that absorbs infrared radiation having a maximum wavelength greater than about 750 nm.

The photosensitive composition and element useful in this invention are described and claimed in copending U.S. Ser. No. 08/723,335, noted above. The method of this invention is useful for providing high quality digital negative images using moderately powered lasers. Moreover, laser imaging need not be preceded by floodwise exposure in this invention. In other words, in contrast to the imaging process described in DE 4,426,820 (noted above), the photosensitive o-diazonaphthoquinone need not be converted to the corresponding indenecarboxylic acid prior to laser imaging. This makes the method useful with plate-setters. Any convenient floodwise exposure means can then be used after digital imaging.

Since the elements useful in this invention are infrared sensitive, digital imaging information can be conveniently utilized to form continuous or halftone images using the moderately powered laser diodes. Moreover, the photosensitive composition is also sensitive to ultraviolet light, thereby making it sensitive to radiation in two regions of the spectrum. In other words, it can be exposed at two different wavelengths.

DETAILED DESCRIPTION OF THE INVENTION

As noted above, the negative-working photosensitive composition useful in this invention contains only two essential components a) and b):

a) either
(i) a mixture of a phenolic resin and an o-diazonaphthoquinone derivative,
(ii) a reaction product of a resin and an o-diazonaphthoquinone reactive derivative, or
(iii) a mixture of (i) and (ii), and b) a compound that absorbs infrared radiation having a maximum wavelength greater than about 750 nm.

The resins useful in the practice of this invention to form a reaction product with an o-diazonaphthoquinone reactive derivative can be any type of resin that has a suitable reactive group for participating in such a reaction. For example, such resins can have a reactive hydroxy or amino group. The phenolic resins defined below are most preferred, but other resins include copolymers of acrylates and methacrylates with hydroxy-containing acrylates or methacrylates, as described for example in U.S. Pat. No. 3,859,099 (Petropoulos et al), for example, a copolymer of hydroxyethyl methacrylate and methyl methacrylate. Still other useful resins include copolymers of styrene (or styrene derivatives) with aminostyrenes, as described for example in U.S. Pat. No. 3,759,711 (Rauner et al), for example, a copolymer of styrene and p-aminostyrene.

The phenolic resins useful herein are light-stable, water-insoluble, alkali-soluble film-forming resins that have a multiplicity of hydroxy groups either on the backbone of the resin or on pendant groups. The resins typically have a molecular weight of at least about 350, and preferably of at least about 1000, as determined by gel permeation chromatography. An upper limit of the molecular weight would be readily apparent to one skilled in the art, but practically it is about 100,000. The resins also generally have a pKa of not more than 11 and as low as 7.

As used herein, the term "phenolic resin" includes, but is not limited to, what are known as novolac resins, resole resins and polyvinyl compounds having phenolic hydroxy groups. Novolac resins are preferred.

Novolac resins are generally polymers that are produced by the condensation reaction of phenols and an aldehyde, such as formaldehyde, or aldehyde-releasing compound capable of undergoing phenol-aldehyde condensation, in the presence of an acid catalyst. Typical novolac resins include, but are not limited to, phenol-formaldehyde resin, cresol-formaldehyde resin, phenol-cresol-formaldehyde resin, p-t-butylphenol-formaldehyde resin and pyrogallol-acetone resins. Such compounds are well known and described for example in U.S. Pat. No. 4,308,368 (Kubo et al), U.S. Pat. No. 4,845,008 (Nishioka et al), U.S. Pat. No. 5,437,952 (Hirai et al) and U.S. Pat. No. 5,491,046 (DeBoer et al), U.S. Pat. No. 5,143,816 (Mizutani et al) and GB 1,546,633 (Eastman Kodak). A particularly useful novolac resin is prepared by reacting m-cresol or phenol with formaldehyde using conventional conditions.

Another useful phenolic resin is what is known as a "resole resin" that is a condensation product of bis-phenol A and formaldehyde. One such resin is commercially available as UCAR phenolic resin BKS-5928 from Georgia Pacific Corporation.

Still another useful phenolic resin is a polyvinyl compound having phenolic hydroxyl groups. Such compounds include, but are not limited to, polyhydroxystyrenes and copolymers containing recurring units of a hydroxystyrene, and polymers and copolymers containing recurring units of halogenated hydroxystyrenes. Such polymers are described for example in U.S. Pat. No. 4,845,008 (noted above). Other hydroxy-containing polyvinyl compounds are described in U.S. Pat. No. 4,306,010 (Uehara et al) and U.S. Pat. No. 4,306,011 (Uehara et al) which are prepared by reacting a polyhydric alcohol and an aldehyde or ketone, several of which are described in the patents. Still other useful phenolic resins are described in U.S. Pat. No. 5,368,977 (Yoda et al).

A mixture of the resins described above can be used, but preferably, a single novolak resin is present in the photosensitive composition.

When the photosensitive composition is formulated as a coating composition in suitable coating solvents, the resin is present in an amount of at least 0.5 weight percent. Preferably, it is present in an amount of from about 1 to about 10 weight percent.

In the dried photosensitive layer of the element useful in this invention, the resin is the predominant material. Generally, it comprises at least 25 weight percent of the layer, and more preferably, it is from about 60 to about 90 weight percent of the dried layer.

In one embodiment, the phenolic resin is present in admixture with an o-diazonaphthoquinone derivative. Such compounds comprise an o-diazonaphthoquinone moiety attached to a ballasting moiety that has a molecular weight of at least 15, but less than about 5000.

Such derivatives have at least one o-naphthoquinonediazide group in the molecule, and which is made more soluble in an alkali solution upon irradiation with actinic light. Such derivatives are prepared from compounds that are well known in the art, including those described, for example in Kosar, *Light-Sensitive System*, John Wiley & Sons Inc., 1965, such as esters or amides with a suitable aromatic polyhydroxy compound or amine. Examples are esters of 2-diazo-1,2-dihydro-1-oxonaphthalenesulfonic acid or carboxylic acid chlorides.

Useful derivatives include, but are not limited to:

2,4-bis(2-diazo-1,2-dihydro-1-oxo-5-naphthalenesulfonyloxy) benzophenone, 2-diazo-1,2-dihydro-1-oxo-5-naphthalenesulfonyloxy-2,2-bis hydroxyphenylpropane monoester, the hexahydroxybenzophenone hexaester of 2-diazo-1,2-dihydro-1-oxo-5-naphthalenesulfonic acid, 2,2'-bis(2-diazo-1,2-dihydro-1-oxo-5-naphthalenesulfonyloxy) biphenyl, 2,2 ',4,4'-tetrakis(2-diazo-1,2-dihydro-1-oxo-5-naphthalenesulfonyloxy)biphenyl, 2,3,4-tris(2-diazo-1,2-dihydro-1-oxo-5-naphthalenesulfonyloxy) benzophenone, 2,4-bis(2-diazo-1,2-dihydro-1-oxo-4-naphthalenesulfonyloxy) benzophenone, 2-diazo-1,2-dihydro-1-oxo-4-naphthalenesulfonyloxy-2,2-bis hydroxyphenylpropane monoester, the hexahydroxybenzophenone hexaester of 2-diazo-1,2-dihydro-1-oxo-4-naphthalenesulfonic acid, 2,2'-bis(2-diazo-1,2-dihydro-1-oxo-4-naphthalenesulfonyloxy) biphenyl, 2,2',4,4'-tetrakis(2-diazo-1,2-dihydro-1-oxo-4-naphthalenesulfonyloxy)biphenyl, 2,3,4-tris(2-diazo-1,2-dihydro-1-oxo-4-naphthalenesulfonyloxy) benzophenone, and others known in the art, for example described in U.S. Pat. No. 5,143,816 (noted above).

The weight ratio of phenolic resin to o-diazonaphthoquinone derivative in this embodiment is generally at least about 0.5:1, and a weight ratio of from about 2:1 to about 6:1 is preferred.

In another and preferred embodiment, a reaction product of a resin (as described above) and an o-diazonaphthoquinone reactive derivative is used in the photosensitive composition. Such a derivative has a functional group (such as chloride or reactive imide group) that can react with a suitable reactive group (for example, a hydroxy group) of the resin (such as a phenolic resin) and thereby become part of the resin, rendering the resin sensitive to light. The reactive group can be in the 4- or 5-position of the o-diazonaphthoquinone molecule.

Representative reactive compounds include sulfonic and carboxylic acid, ester or amide derivatives of the o-diazonaphthoquinone moiety. Preferred compounds are the sulfonyl chloride or esters, and the sulfonyl chlorides are most preferred. Reactions with the phenolic resins are well known in the art, being described for example in GB 1,546,633 (noted above), U.S. Pat. No. 4,308,368 (noted above) and U.S. Pat. No. 5,145,763 (Bassett et al).

Whether in admixture or reacted with a resin, the amount of o-diazonaphthoquinone moiety in the dried photosensitive composition is generally at least about 1 weight percent, and more preferably from about 3 to about 50 weight percent. A mixture of different o-diazonaphthoquinone derivatives or reactive derivatives can be used in the same composition, but preferably, only a single derivative is used.

The second essential component of the photosensitive composition is an infrared radiation absorbing compound (or IR absorbing compound), or mixture thereof. Such compounds typically have a maximum absorption wavelength ($\lambda max$) in the region of at least about 750 nm, that is in the infrared region and near infrared of the spectrum, and more particularly, from about 800 to about 1100 nm. The compounds can be dyes or pigments, and a wide range of compounds are well known in the art (including U.S. Pat. No. 4,912,083, U.S. Pat. No. 4,942,141, U.S. Pat. No. 4,948,776, U.S. Pat. No. 4,948,777, U.S. Pat. No. 4,948,778, U.S. Pat. No. 4,950,639, U.S. Pat. No. 4,950,640, U.S. Pat. No. 4,952,552, U.S. Pat. No. 4,973,572, U.S. Pat. No. 5,036,040 and U.S. Pat. No. 5,166,024). Classes of materials that are useful include, but are not limited to, squarylium, croconate, cyanine (including phthalocyanine), merocyanine, chalcogenopyryloarylidene, oxyindolizine, quinoid, indolizine, pyrylium and metal dithiolene dyes or pigments. Other useful classes include thiazine, azulenium and xanthene dyes. Particularly useful infrared absorbing dyes are of the cyanine class.

The amount of infrared absorbing compound in the dried photosensitive layer is generally sufficient to provide an optical density of at least 0.5 in the layer, and preferably, an optical density of from about 1 to about 3. This range would accommodate a wide variety of compounds having vastly different extinction coefficients. Generally, this is at least 1 weight percent, and preferably from 5 to 25 weight percent.

Optional, non-essential components of the photosensitive composition include colorants, sensitizers, stabilizers, exposure indicators and surfactants in conventional amounts. In preferred embodiments, a surfactant (such as silicone material) may be present, but in most preferred embodiments, none of these materials are present.

Obviously, the photosensitive composition is coated out of one or more suitable organic solvents that have no effect on the sensitivity of the composition. Various solvents for this purpose are well known, but acetone and 1-methoxy-2-propanol are preferred. The essential components of the composition are dissolved in the solvents in suitable proportions.

Suitable conditions for drying the photosensitive composition involve heating for a period of time of from about 0.5 to about 5 minutes at a temperature in the range of from about 20 to about 150 ° C.

To form a photosensitive element, the photosensitive composition is applied (usually by coating techniques) onto a suitable support, such as a metal, polymeric film, ceramics or polymeric-coated paper using conventional procedures and equipment. Suitable metals include aluminum, zinc or steel, but preferably, the metal is aluminum. A most preferred support is an electrochemically grained and sulfuric acid anodized aluminum sheet that has been further treated with an acrylamide-vinylphosphonic acid copolymer according to the teaching in U.S. Pat. No. 5,368,974. Such elements are generally known as lithographic printing plates, but other useful elements include printed circuit boards.

The thickness of the resulting imaging layer, after drying, on the support can vary widely, but typically it is in the range of from about 0.5 to about 2 μm, and preferably from about 1 to about 1.5

No other essential layers are provided on the element. In particular, there are no protective or other type of layers over the photosensitive imaging layer. Optional, but not preferred subbing or antihalation layers can be disposed under the imaging layer, or on the backside of the support (such as when the support is a transparent polymeric film).

The elements described herein are uniquely adapted for "direct-to-plate" imaging applications. Such systems utilize digitized image formation, as stored on a computer disk, compact disk, computer tape or other digital information storage media, or information that can be provided directly from a scanner, that is intended to be printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the unexposed photosensitive element of this invention. Thus, no exposed and processed films are needed for imaging of the elements, as in the conventional lithographic imaging processes.

Laser imaging can be carried out using any moderate or high-intensity laser diode writing device. Specifically, a laser printing apparatus is provided that includes a mechanism for scanning the write beam across the element to generate an image without ablation. The intensity of the write beam generated at the laser diode source at the element is at least about 10 milliwatts/$\mu m^2$ (preferably from 10 to 1000 milliwatts/$\mu m^2$). During operation, the element to be exposed is placed in the retaining mechanism of the writing device and the write beam is scanned across the element to generate an image.

Following laser imaging, the element is subjected to floodwise (or complete) exposure to a suitable ultraviolet light source. This irradiation converts the o-diazonaphthoquinone moiety in the non-imaged regions of the photosensitive layer into the corresponding indenecarboxylic acid. Irradiation can be achieved using any suitable source of ultraviolet radiation including carbon arc lamps, mercury vapor lamps, fluorescent lamps, tungsten filament lamps and photoflood lamps. The level of exposure is usually at least 10 millijoules/$cm^2$. Such exposure sources can include units designed for use with lithographic plate processors.

Lastly, the element is then developed in an alkaline developer solution until the non-image areas are removed to provide the desired negative image. Development can be carried out under conventional conditions for from about 30 to about 120 seconds. One useful aqueous alkaline developer solution is a silicate solution containing an alkali metal silicate or metasilicate. Such a developer solution can be obtained from Eastman Kodak Company as KODAK PRODUCTION SERIES Machine Developer/P.

After development, the element is usually treated with a finisher such as gum arabic.

The following examples are provided to illustrate the practice of this invention, and not to limit it in any manner. Unless otherwise noted, all percentages are by weight.

EXAMPLE 1

A photosensitive coating formulation was prepared as follows:

| COMPONENT | PARTS |
|---|---|
| Cresol-formaldehyde novolac resin | 2.585 |
| 2,4-Bis(2-diazo-1,2-dihydro-1-oxo-5-naphthalene-sulfonyloxy)benzophenone | 1.551 |
| 2-[2-[2-chloro-3-[(1,3-dihydro-1,1,3-trimethyl-2H-benz[e]indol-2-ylidene)ethylidene-1-cyclohexen-1-yl]ethenyl]-1,1,3-trimethyl-1H-benz[e]indolium, salt with 4-methylbenzenesulfonic acid IR absorbing dye | 0.620 |
| CG 21-1005 dye colorant | 0.103 |
| BYK 307 polyether-modified polydimethylsiloxane from BYK-Chemie | 0.010 |
| Acetone solvent | 4.043 |
| 1-Methoxy-2-propanol solvent | 91.087 |

This formulation was applied to give a dry coating weight of about 1 g/$m^2$ onto an electrochemically grained and sulfuric acid anodized aluminum sheet that had been further treated with an acrylamide-vinylphosphonic acid copolymer (according to U.S. Pat. No. 5,368,974, noted above) to form an unexposed lithographic printing plate.

Two of these plates (A and B) were imaged with a 500 milliwatt diode laser emitting a modulated pulse centered at 830 nm. Plate A was then given a 7.5 unit flood-exposure with an Olec exposure unit in the high intensity mode and processed with KODAK PRODUCTION SERIES Machine Developer/P to provide a high resolution negative image. Plate B was similarly imaged and processed with the flood exposure increased to 15 units. Fine highlight dots were again retained after processing to provide a negative image. The optical density of the processed coating, as determined by reflectance, was 0.80 compared with 0.83 for Plate A, indicating wide latitude with respect to the flood exposure dose.

EXAMPLE 2

A different photosensitive coating formulation was prepared like that in Example 1 except that an equal amount of 2-diazo-1,2-dihydro-1-oxo-5-naphthalenesulfonyloxy-2,2-bis(hydroxyphenyl)propane monoester was used in place of 2,4-bis(2-diazo-1,2-dihydro-1-oxo-5-naphthalenesulfonyloxy)benzophenone. The formulation was used to prepare a lithographic printing plate as noted above.

The plate was imaged at energies of about 225 and 550 millijoules/$cm^2$ with a 500 milliwatt diode laser emitting a modulated pulse centered at 830 nm, flood exposed with 15 units from an Olec exposure unit mode and developed as described in Example 1, to reveal a high resolution negative image.

EXAMPLE 3

Example 2 was repeated except that an equal amount of hexahydroxybenzophenone hexaester of 2-diazo-1,2-dihydro-1-oxo-5-naphthalenesulfonic acid (available from Toyo Gosei) was used in place of 2-diazo-1,2-dihydro-1-oxo-5-naphthalenesulfonyloxy-2,2-bis(hydroxyphenyl) propane monoester. A high resolution negative image was obtained by processing the resulting lithographic printing plate.

EXAMPLE 4

A photosensitive coating formulation was prepared using a cresol-formaldehyde resin (purchased from Schenectady Chemical Company) derivatized with 2-diazo-1,2-dihydro-1-oxo-5-naphthalenesulfonyl chloride (5.3 parts), the Example 1 infrared absorbing dye (0.7 part), and 1-methoxy-2-propanol solvent (94.0 parts).

This formulation was used to prepare a lithographic printing plate that was imaged and processed as described in Example 2 to provide a high resolution negative image.

EXAMPLE 5

A photosensitive coating formulation was prepared using a poly(4-hydroxystyrene) resin (purchased from Hoescht-Celanese Company) derivatized with 2-diazo-1,2-dihydro-1-oxo-5-naphthalenesulfonyl chloride (5.3 parts), the Example 1 infrared absorbing dye (0.7 part), and 1-methoxy-2-propanol solvent (94.0 parts).

This formulation was used to prepare a lithographic printing plate that was imaged and processed as described in Example 2 to provide a high resolution negative image.

EXAMPLE 6

A photosensitive coating formulation was prepared using a cresol-formaldehyde resin (purchased from Schenectady Chemical Co.) derivatized with 2-diazo-1,2-dihydro-1-oxo-4-naphthalenesulfonyl chloride (5.3 parts), the Example 1 infrared absorbing dye (0.7 part), and 1-methoxy-2-propanol solvent (94.0 parts).

This formulation was used to prepare a lithographic printing plate that was imaged and processed as described in Example 2 to provide a high resolution negative image.

This formulation was similarly coated on a poly(ethylene terephthalate) film support that had been modified with a hydrophilic titanium dioxide layer (5.14 g/m$^2$ $TiO_2$ in 1.58 g/m$^2$ gelatin) and similarly imaged and processed to provide a high resolution negative image.

EXAMPLE 7

A photosensitive coating formulation was prepared using a mixture of the derivatized resins of Example 4 and 6 (2.65 parts for each), the Example 1 infrared absorbing dye (0.7 part), and 1-methoxy-2-propanol solvent (94.0 parts).

This formulation was used to prepare a lithographic printing plate that was imaged and processed as described in Example 2 to provide a high resolution negative image.

The resulting printing plate was mounted on a conventional printing press and used to produce at least 40,000 copies of the desired image without any degradation of the plate image, despite conditions designed to accelerate plate wear.

The invention has been described in detail with particular reference to preferred embodiments thereof, but it will be understood that variations and modifications can be effected within the spirit and scope of the invention.

We claim:

1. A method for imaging a photosensitive element comprising the steps of, in order:

A) providing a negative-working photosensitive element consisting essentially of a support having thereon a negative-working photosensitive composition consisting essentially of:

a)

(i) a mixture of a phenolic resin and an o-diazonaphthoquinone derivative, (ii) a reaction product of a phenolic resin and an o-diazonaphthoquinone reactive derivative, or (iii) a mixture of (i) and (ii), and b) a compound that absorbs infrared radiation having a maximum wavelength greater than about 750 nm, B) without prior floodwise exposure to light, imagewise exposing said element with an infrared emitting laser, C) floodwise exposing said element, and D) contacting said element with an aqueous developing solution to remove the non-image areas of said photosensitive layer.

2. The method of claim 1 wherein a) is said reaction product (ii).

3. The method of claim 1 wherein said phenolic resin is a novolac resin.

4. The method of claim 1 wherein said o-diazonaphthoquinone reactive derivative is a sulfonic acid or carboxylic acid ester of o-diazonaphthoquinone.

5. The method of claim 1 wherein said o-diazonaphthoquinone derivative is 2,4-bis(2-diazo-1,2-dihydro-1-oxo-5-naphthalenesulfonyloxy)benzophenone, 2-diazo-1,2-dihydro1-oxo-5-naphthalenesulfonyloxy-2,2-bis(hydroxyphenyl) propane monoester, the hexahydroxybenzophenone hexaester of 2-diazo-1,2-dihydro-1-oxo-5-naphthalenesulfonic acid, 2,2'-bis(2-diazo-1,2-dihydro1-oxo-5-naphthalenesulfonyloxy)biphenyl, 2,2',4,4'-tetrakis (2-diazo-1,2-dihydro1-oxo-5-naphthalenesulfonyloxy) biphenyl, 2,3,4-tris(2-diazo-1,2-dihydro1-oxo-5-naphthalenesulfonyloxy)benzophenone, 2,4-bis(2-diazo-1,2-dihydro1-oxo-4-naphthalenesulfonyloxy)benzophenone, 2-diazo-1,2-dihydro-1-oxo-4-naphthalenesulfonyloxy-2,2-bis hydroxyphenylpropane monoester, the hexahydroxybenzophenone hexaester of 2-diazo-1,2-dihydro-1-oxo-4-naphthalenesulfonic acid, 2,2'-bis(2-diazo-1,2-dihydro1-oxo-4-naphthalenesulfonyloxy)biphenyl, 2,2',4,4'-tetrakis (2-diazo-1,2-dihydro1-oxo-4-naphthalenesulfonyloxy) biphenyl or 2,3,4-tris(2-diazo-1,2-dihydro1-oxo-4-naphthalenesulfonyloxy)benzophenone.

6. The method of claim 1 wherein the o-diazonaphthoquinone reactive derivative in said mixture has a non-polymeric ballast group having a molecular weight of at least about 15.

7. The method of claim 1 wherein said infrared radiation absorbing compound is a squarylium, croconate, cyanine, merocyanine, indolizine, pyrylium or metal dithiolene dye or pigment that absorbs infrared radiation at a wavelength of from about 800 to about 1100 nm.

8. The method of claim 1 wherein said infrared radiation absorbing compound is present in an amount sufficient to provide an optical density of at least 0.5.

9. The method of claim 8 wherein said infrared radiation absorbing compound is present in an amount sufficient to provide an optical density of from about 1 to about 3.

10. The method of claim 1 wherein said support is a sheet of grained and anodized aluminum.

11. A method for imaging a photosensitive element comprising the steps of, in order:

A) providing a negative-working photosensitive element consisting essentially of a grained and anodized aluminum support having thereon, as the outer layer, a single negative-working layer comprising a photosensitive composition consisting essentially of a reaction product of a phenol-formaldehyde novolac resin and 2-diazo-1,2-dihydro1-oxo-4 or 5-naphthalenesulfonyl chloride, and a cyanine dye that absorbs infrared radiation having a wavelength of from about 800 to about 1100 nm, B) without prior floodwise exposure to light, imagewise exposing the element with an infrared emitting laser at an intensity at the photosensitive layer surface of from about 10 to about 1000 milliwatts/mm, C) floodwise exposing said element, and D) contacting said element with an aqueous developing solution to remove the non-image areas of said photosensitive layer.

12. The method of claim 11 wherein said aqueous developing solution is an alkaline solution.

13. The method of claim 11 wherein said o-diazonaphthoquinone reactive derivative is 2-diazo-1,2-dihydro1-oxo-5-naphthalenesulfonyl chloride.

14. The method of claim 11 wherein said infrared radiation absorbing compound is a cyanine dye.

* * * * *

UNITED STATES PATENT AND TRADEMARK OFFICE

CERTIFICATE OF CORRECTION

PATENT NO. : 5,705,322
DATED : Jan. 6, 1998
INVENTOR(S) : Paul R. West, et al

It is certified that error appears in the above-identified patent and that said Letters Patent is hereby corrected as shown below:

| | |
|---|---|
| Col. 10, claims 5, 11 and 13 | delete "dihydrol" and insert therefor -- dihydro-1 -- lines 2, 5, 7, 8, 10, 14, 16, 17, 45, 62 |

Signed and Sealed this

Thirty-first Day of March, 1998

*Attest:*

BRUCE LEHMAN

*Attesting Officer*

*Commissioner of Patents and Trademarks*